United States Patent [19]
Buchanan et al.
[11] 3,832,707
[45] Aug. 27, 1974

[54] LOW COST DIGITAL TO SYNCHRO CONVERTER

[75] Inventors: James E. Buchanan, Bowie; Carl W. Nelson, Glen Burnie, both of Md.
[73] Assignee: Westinghouse Electric Corporation, Pittsburgh, Pa.

[22] Filed: Aug. 30, 1972
[21] Appl. No.: 285,393

[52] U.S. Cl. ..... 340/347 DA, 340/347 SY, 307/251
[51] Int. Cl. .......... H03k 13/04
[58] Field of Search .......... 340/347 DA, 347 SY; 307/251, 279, 304

[56] References Cited

UNITED STATES PATENTS

| | | | |
|---|---|---|---|
| 3,016,528 | 1/1962 | Villars | 340/347 DA |
| 3,277,464 | 10/1966 | Naydan et al. | 340/347 DA |
| 3,541,354 | 11/1970 | Basham | 340/347 DA X |
| 3,553,647 | 1/1971 | Bullock | 340/347 DA X |
| 3,651,517 | 3/1972 | Kurek et al. | 340/347 DA |
| 3,670,326 | 6/1972 | Sloane et al. | 340/347 DA |

*Primary Examiner*—Charles D. Miller
*Attorney, Agent, or Firm*—D. Schron

[57] ABSTRACT

A digital to analog (D/A) converter suitable for application to digital to synchro (D/S) conversion comprises serial MOS FET (Metallic Oxide Semiconductor-Field Effect Transistor) switches and an inverting amplifier, or buffer, to compensate for variations in FET resistance in the ON state. A reference voltage of a given polarity is gated ON in one FET and inverted in polarity in an amplifier with a gain of 1.0 for input to a bank of FET switches associated with a binary resistance network, accomplishing directly the conversion of digital data to an analog equivalent output. The reference voltage thereby gated in the first FET with one polarity is subsequently gated in the second FET switches, of the bank associated with the network, and with the opposite polarity, such that a nearly constant resistance path is afforded from the reference voltage to the output of the second FET switches. Employing identical FET switches throughout the D/A converter, the non-linear properties of the FET switches are compensated regardless of reference voltage polarity. To improve further the accuracy of D/A conversion of the invention, an input resistance is selected for the inverting amplifier equal in value to the resistance of the most significant bit resistor. Compensating resistors affording resistance equalization are provided for at least a few of the next, most significant bit positions resulting in highly accurate digital to analog and digital to synchro conversion using low cost MOS FET switches with high ON resistance.

13 Claims, 6 Drawing Figures

LOW COST DIGITAL TO SYNCHRO CONVERTER

BACKGROUND OF THE INVENTION

1. Field of the Invention

This invention relates to digital to analog (D/A) converters with a particular application to digital to synchro (D/S) converters requiring analog voltages for synchromechanism control.

2. State of the Prior Art

In general a digital to synchro converter (D/S) is constructed in a manner similar to a typical digital to analog converter (D/A). In the typical D/A converter, a DC reference voltage is switched to various branches of a resistor network. The network develops an output voltage or current proportional to the digital data used to control the state (ON or OFF) of the switches. For the D/S converter, an AC or oscillatory reference voltage is used so that the converter output will be an oscillatory signal of a controllable amplitude. The use of an AC reference voltage places several stringent requirements on the switches used to switch the AC reference to the resistor network.

The conventional bipolar transistor switch requires an elaborate biasing scheme to maintain an "ON" condition when switching an AC reference voltage, since the latter changes in polarity as well as amplitude. The field effect transistor (FET) initially appears ideal for use as an AC reference switch, since the FET does not require gate current but only a suitable voltage level to be biased selectively ON or OFF. Use of MOS FET switches also is very desirable, in view of the relatively low cost thereof, and the availability of a large number of MOS FET switches in a single package.

However, a closer examination shows that a junction FET requires almost as elaborate a biasing scheme as the bipolar transistor. Particularly the ON resistance of a MOS FET is a function of the voltage level being switched. Using a conventional biasing scheme for a typical MOS FET switch, the ON resistance may be in the range of 150 ohms for a (+)5 volt level but may change to 400 ohms or more for a (−)5 volt level; these characteristics are shown in FIG. 1. This large change in ON resistance is a serious problem when switching a combination of positive or negative reference voltages to a binary network, such as is shown in FIG. 2. This problem typically prevents use of such switches in the construction of a highly accurate and linear D/A or D/S.

Referring to FIG. 2, the converter error due to the change in ON resistance can be illustrated as follows. Recognizing that the resistance of resistor $2^N$R must be kept from becoming too large a value, R must be in the order of 5K ohms to 20K ohms for a typical 9 bit converter ($2^9 = 512$ possible output levels). Even with R equal to 5K for a 9 bit application, $2^N R = 512 \times$ 5Kohms = 2.56 Meg. ohms which is an extremely large value resistor for a thin or thick film resistor network. Moreover, the error due to the switch resistance for the MSB with R = 5K ohms is +V reference error = 150/5,000 + 150 X 100 = 2.91 percent −V reference error = 500/5,000 + 500 X 100 = 9.09 percent Since the error is not equal for each condition the output will not be linear and cannot be treated as a gain or slope error and compensated.

SUMMARY OF THE INVENTION

Limitations of the MOS FET switch when used in a D/A converter are overcome by employing a series FET switch of characteristics identical to those of the reference FET switches associated with each bit of digital data. In accordance with the present invention, two reference voltages of the same magnitude, but differing in sign or phase, are gated by separate FET switches to a common inverting amplifier by a sign select circuit. The sign select circuit operates in connection with proper biasing to ensure the operating characteristics, i.e., ON resistance, of the sign selected FET switches. The inverting amplifier of gain 1.0 is designed to have an input resistance equal in value to the resistor of the most significant bit (SMB) of the binary network.

For each bit of digital data having a logical "1" state, a related FET switch is gated on. Tracing the path of reference voltage, it is seen that the sign selected FET switch is in series with each of the bit selected FET switches such that the reference voltage has been switched, or gated, through two FET stages. Furthermore, due to the inverting action of the unity gain amplifier, the sign selected FET and the bit selected FET are always operated with opposite polarity input voltages. The net effect then is to provide a compensation for the differing, positive and negative ON characteristics of the FET switches. For the most significant bit (MSB), complete equalization is achieved by making the input resistance of the inverting amplifier equal in value to the resistor of the binary network associated with the MSB. Since the remaining resistors of the binary network are necessarily $2^N$ multiplies of the MSB resistor, compensation is not exact for the other bits of digital data. The fractional error would follow according to ½, ¼, ⅛, and so forth from the MSB to the LSB (least significant bit). These remaining bits can be compensated by including a resistor in the output of each bit FET switch to ground. The value of the compensating resistor, so that the equivalent resistance seen by the FET switch is always equal to R, is selected in accordance with:

$$X = 2^{N-1} \cdot R / 2^{N-1} - 1$$

where X is the value of the compensating resistor and N is the bit position of that resistor. As shown, therefore, no compensating resistor is required for the MSB, but the next MSB and successive less significant bits have compensating resistors of the values 2R, 4/3R, 8/7R, 16/15R, . . . , respectively. In practice it is not necessary to add the compensating resistors beyond the third or fourth MSB because the FET switch resistance becomes less significant when switched in series with a value of 8/7R, 16/15R and greater. In addition, the error contribution of less than complete equalization is accordingly reduced by a factor of $2^N$ for the Nth bit of digital data, where N is the bit position, from the second MSB to the LSB.

Further enhancement of D/A accuracy is realized by using a common MOS switching transistor with all of the switches contained in a common integrated structure for matching.

The configuration of the circuit of the invention is designed primarily for a digital to synchro (D/S) application where two D/S converters are used to drive a two-phase synchromechanism. In a synchro application where only output ratios are important, a common MOS integrated circuit switch array can be used for both D/S converters to match the set of converters initially as well as over a broad temperature range.

The above and other objects and features of the invention will be better understood from the following detailed description of the invention taken in connection with the accompanying drawings.

DETAILED DESCRIPTION OF THE INVENTION

Figure 4:
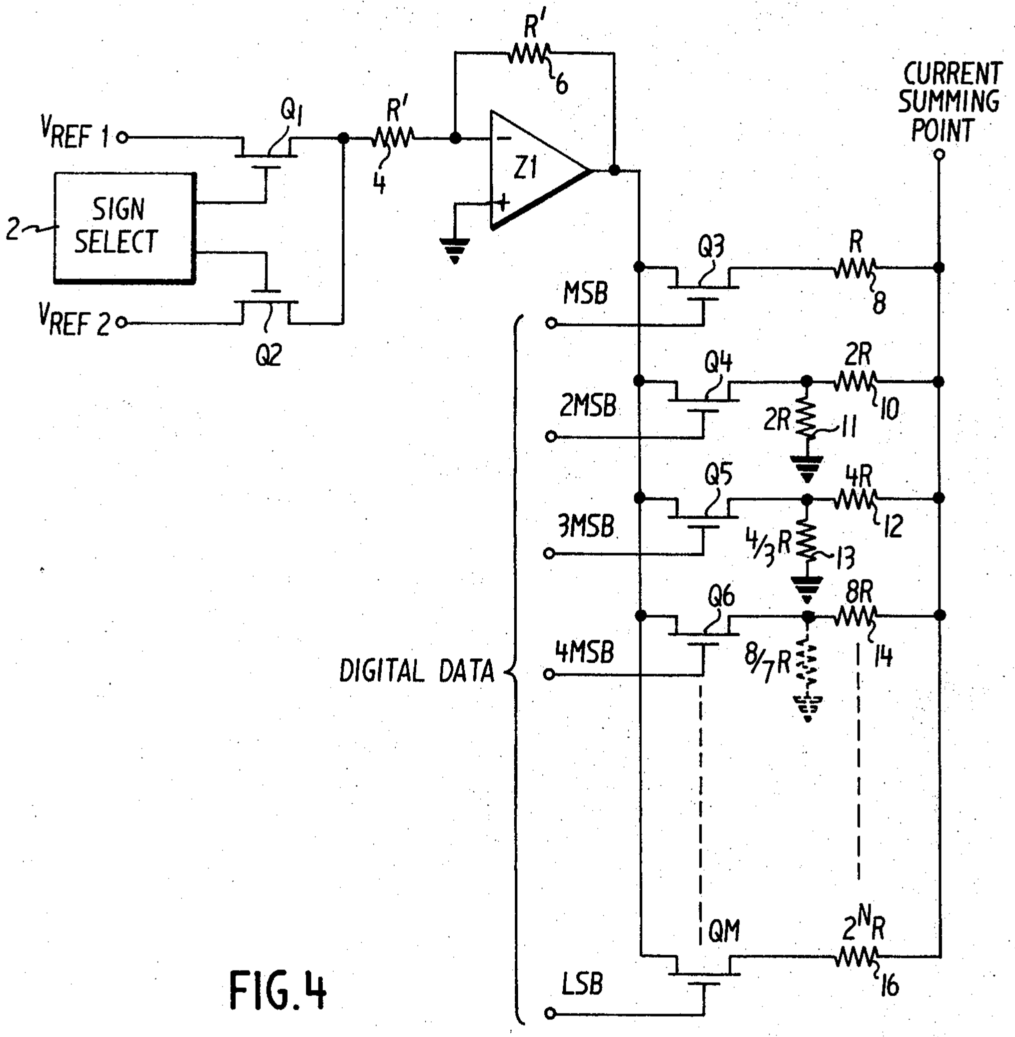
FIG. 4 is a circuit diagram of a D/A converter in accordance with the invention, including series FET switches, an inverting amplifier and a binary resistor network.

With reference to the drawings and particularly to FIG. 4, the salient features of a digital to synchro (D/S) converter in accordance with the invention are shown. Reference voltages of a given magnitude and polarity, or phase, are gated by a SIGN SELECT switch driver circuit 2. In one case, field effect transistor (FET) Q1 is gated on, passing $V_{Ref\,1}$ to input resistor 4 shown to have value R′, and FET Q2 is gated off. In a second case, FET Q2 is gated on, passing $V_{Ref\,2}$ to input resistor 4, also of value R′, and FET Q1 is gated off.

Figure 1:
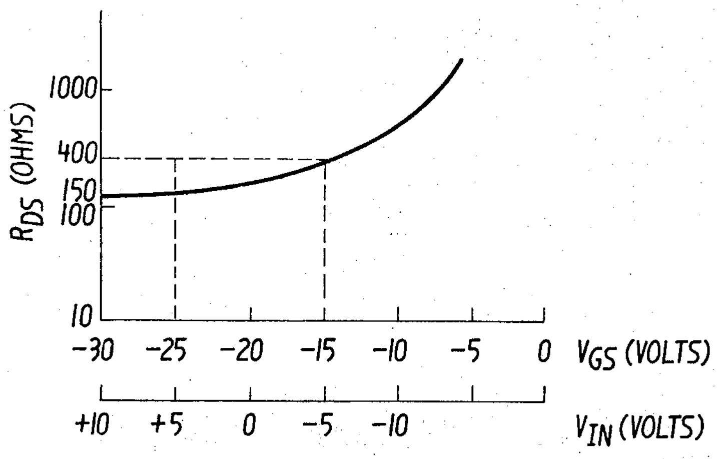
FIG. 1 is a plot of the ON resistance characteristics of a typical MOS field effect transistor switch.

The typical ON resistance characteristic of an FET, such as Q1 and Q2 in FIG. 4, is illustrated in FIG. 1. In FIG. 1, scales are shown both for the gate source voltage, $V_{GS}$, and the switched input voltage, $V_{IN}$, corresponding to typical characteristics for a given FET and a selected operating condition, respectively. As an example of an operating condition of the invention, the FET is biased such that a relative +5 volt value of $V_{IN}$ produces an $R_{DS}$ (drain-source resistance) of 150 ohms and a relative −5 volt value of $V_{IN}$ produces an $R_{DS}$ of 400 ohms.

Returning to FIG. 4, operational amplifier Z1 includes an input impedance R′, shown as input resistor 4, and a feedback resistor 6, also of value R′. The inverting input of amplifier Z1 is connected to the junction of resistors 4 and 6, and the non-inverting input thereof is grounded. Amplifier Z1 then serves to invert the polarity of voltage made input to resistor 4, and to reproduce with a gain of 1.0 the magnitude of input voltage. Amplifier Z1 also serves as a buffer amplifier for impedance matching. The output of the inverter amplifier Z1 provides a source voltage common to reference switches Q3 through QM of the binary resistor network, corresponding to the succession of N bits MSB, 2MSB, 3MSB . . . LSB, respectively. The network further includes the resistors 8, 10, 12, 14 . . . 16 of the relative values R, 2R, 4R, 8R, . . . $2^N$R, respectively corresponding to the bits.

The reference switches selectively are gated ON in response to signals applied to the gates thereof, corresponding to the digital data, from the most significant (MSB) to the least significant bit (LSB). For example, assume the digital data has a binary number such that only the MSB is at a logic 1 and all other bits are at a logic 0. Also, $V_{Ref\,1}$ of +5V is selected by SIGN SELECT circuit 1. The ON resistance of Q1 is then 150 ohms and a positive voltage is made input to inverter Z1. The output of Z1 is then −5V so that the ON resistance of Q3 is 400 ohms. From $V_{Ref\,1}$ to binary network resistor 8, a series resistance of 550 ohms obtains. At a later time, assume $V_{Ref\,2}$ of −5V is selected by SIGN SELECT circuit 1. The ON resistance of Q2 is then 400 ohms and a negative voltage is presented to inverter Z1. The output of Z1 is then +5V, so that the ON resistance of Q3 is 150 ohms. Again, from $V_{Ref\,2}$ to binary network resistor 8, a series resistance of 550 ohms obtains.

Figure 3:
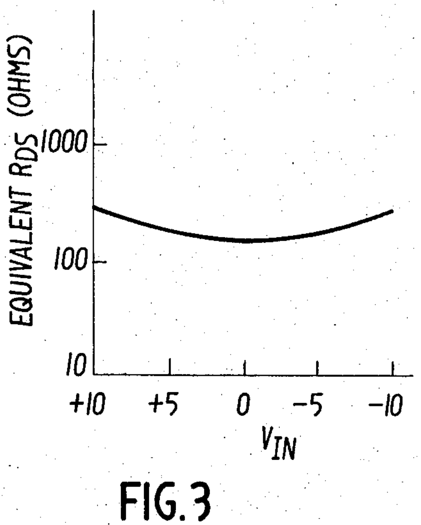
FIG. 3 is a plot of the equivalent ON resistance of the switch arrangement of the invention.

Thus, when a bit is selected and its related MOS switch is turned on, the reference voltage is switched through two MOS switches, the first being the SIGN SELECTED one of Q1 and Q2, and the second being the corresponding MOS switch Q3, Q4 . . . QM. Applying the above feature of the invention and using the FET characteristics of FIG. 1, an equivalent ON resistance of the series FET switches and inverting amplifier Z1 may be plotted as shown in FIG. 3.

For the MSB, complete equalization can be achieved. Since the resistor values for the remaining bits are not equal to R, the compensation is not exact for the remaining bits, but is ½, ¼, ⅛ and so forth of complete compensation. The remaining bits illustrated in FIG. 4 as 2MSB, 3MSB, etc. can be compensated exactly by adding a compensating resistor to ground from the junction of the FET output and its associated output resistor of the binary network. As shown for FET Q4, a compensating resistor 11 of value 2R is connected between the noted junction and ground. Similarly, for FET Q5, a compensating resistor 13 of value 4/3R is so connected, the value of 4/3R being the value that, with resistor 12, will provide an impedance of R to the MOS switch Q5. With the compensating resistors, the equivalent resistance seen by the MOS switches is always equal to R. In general, the value X of the compensating resistor for the Nth bit position, as before noted, is given by:

$$X = 2^{N-1} \cdot R/2^{N-1} - 1$$

In practice it is not necessary to add the additional compensating resistors beyond the 3rd or 4th MSB because the switch resistance in series with the binary network resistance rapidly becomes insignificant — e.g., when switching to a value of 8R, 16R or greater. Further, the error contribution in the output of uncompensated stages correspondingly is divided by $2^N$, where N represents the particular bit position of the stage; thus, beyond the 3rd or 4th MSB, the error contribution becomes insignificant.

Figures 2, 5:
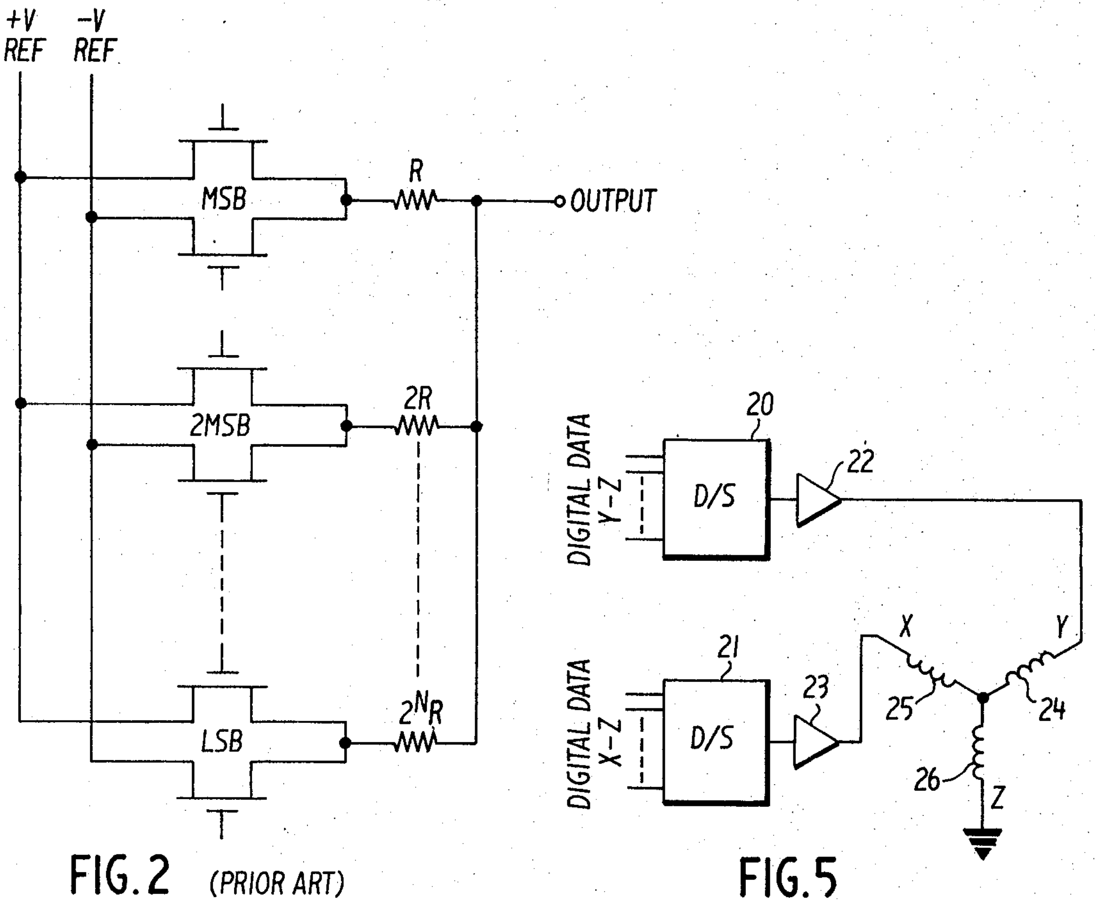
FIG. 2 (PRIOR ART) FIG. 5
FIG. 2 shows the circuit diagram of a common binary, digital to analog network employing FET switches and resistors.
FIG. 5 illustrates the application of the invention to a digital to synchro converter.

The features of the invention are realized to the maximum extent when implemented with common MOS switching transistors as contained in a common integrated structure where close matching of parameters is possible. Such an implementation is well suited for application to a digital to synchro (D/S) converter where two D/S converters are used to excite a synchro, as shown in FIG. 5. Particularly, a synchro responds primarily to the ratio of two input analog voltages in defining an angular position of the rotor, i.e., to which the rotor will be rotated in response to the applied signals. Thus, some variation in the absolute value of the respective voltages can be tolerated, provided they remain in relative proportion while maintaining high accuracy of the rotor position control.

As shown in FIG. 5, each of the D/S converters 20 and 21 includes a respectively associated D/A converter in accordance with the invention and particularly as shown in FIG. 4. The D/A converters of each thus are preferably contained in a common integrated structure to maintain the close matching of parameters, as previously discussed. This affords matching of the two D/A converters initially as well as over a broad temperature range, despite the temperature dependency of the individual MOS FET's contained in each of the D/A converters.

Digital data of a desired number of bits is supplied respectively to the D/S converters 20 and 21 by a suitable processor (not shown) to define a desired synchro control, i.e., a given synchro shaft angle. The output of D/S converter 20 is buffered in amplifier 22 and excites the Y–Z synchro winding 24. The output of D/S converter 21 is buffered in amplifier 23 and excites the X–Z synchro winding 25. The Z synchro winding 26 is grounded, as shown, to complete the circuit.

In the foregoing, $V_{Ref\,1}$ and $V_{Ref\,2}$ comprise AC reference voltages of opposite phase, which vary in amplitude in a cyclic and continuous manner between peak voltages of equal amplitude but opposite polarities. The operation of the SIGN SELECT circuit 2 is synchronized with the cycles of the reference voltages to select the appropriate phase or sign of the reference signals. Transistors Q1 and Q2 thus afford both the switching function for selecting at the appropriate time the appropriate magnitude and phase of the reference voltage and as well afford the compensation function, as above discussed. Alternative arrangements for achieving the switching function of the alternately gated transistors Q1 and Q2 may be employed, while nevertheless retaining the benefits of the invention.

The benefits of the compensation techniques of the invention as aforedescribed as well may be realized in a DC digital to analog converter. Herein, the two reference voltage inputs may be of equal DC amplitude values but opposite polarities. The improved linearity afforded by the invention serves to equalize the incremental or step values of the analog voltages as converted from a succession of digital inputs. Although linearity of the output is greatly improved over a broad temperature range, the absolute values of the analog outputs may vary, in the event that temperature variations to which the system is exposed exceed a relatively small range.

Figure 6:
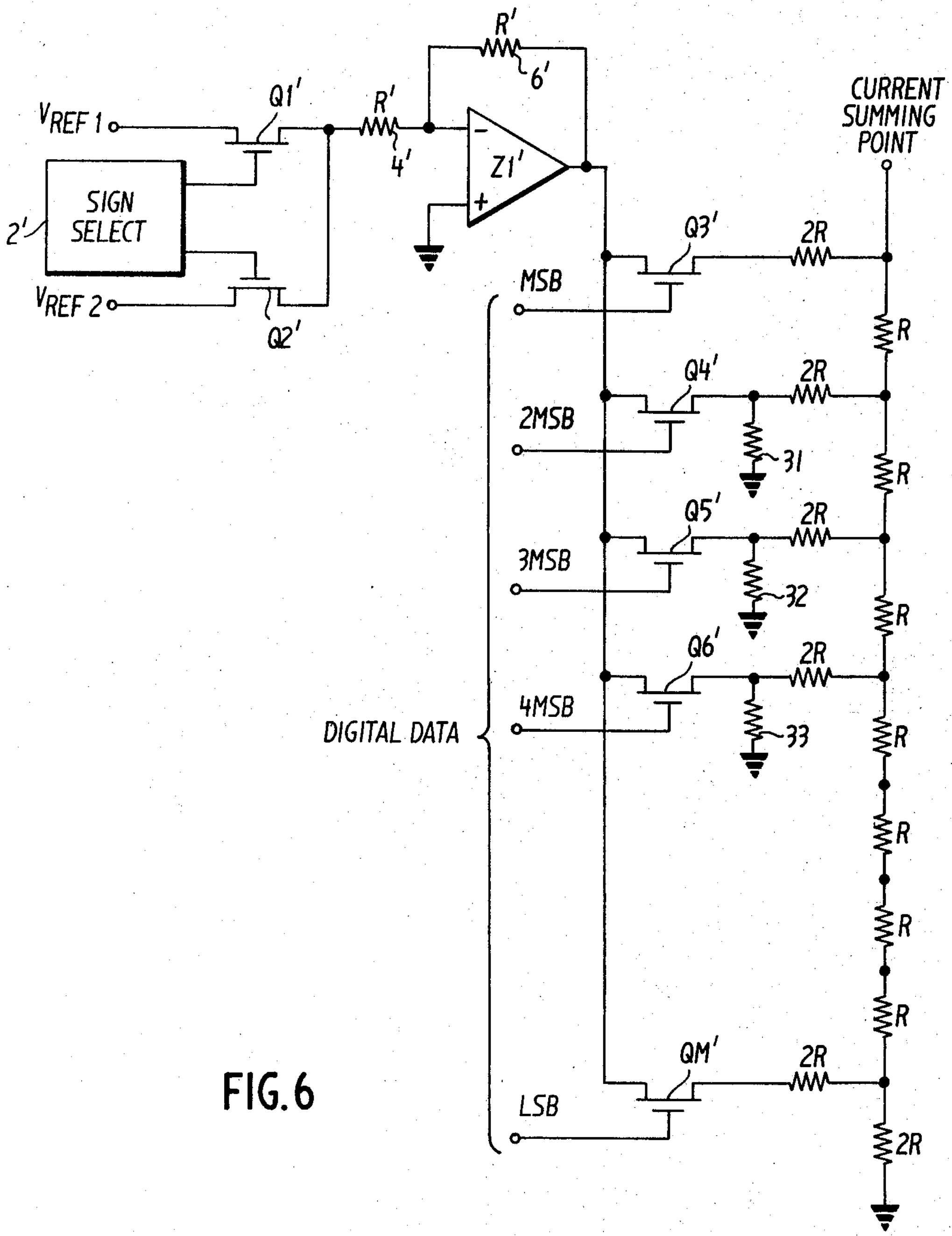
FIG. 6 is a circuit diagram of a digital to analog converter in accordance with the invention, utilizing a resistor network of the R-2R ladder type.

Alternatives to the binary resistor network shown in FIG. 4 may be employed while realizing the benefits of the invention. As an example thereof in FIG. 6 is shown a D/A converter employing a R-2R ladder network. Elements identical to those in FIG. 4 are identified by identical but primed numerals. Accordingly, the FET switches Q'3 through Q'M are again illustrated. Associated with each FET switch in series with the conducting path thereof is a resistor of value 2R, the plurality of those resistors further being connected to adjacent such resistors by further resistors of value R. The junction of the interconnecting resistor R and the resistor 2R for the LSB is connected to ground through a resistor of value 2R. Representative values are R = 25K ohms and thus 2R = 50K ohms.

Compensating resistors similar to those in FIG. 4 may be employed in FIG. 6. As illustrated, particularly, resistors 31, 32 . . . 33 may be connected between the FET switch output, at the junction thereof with the series resistor 2R of the ladder network, and ground. In this configuration, resistors 31, 32 . . . 33 have a value of 2R and, for the specific example given of R = 25K ohms, of 50K ohms. In the alternative, a compensating resistor may be connected to ground from the output of the transistor Q'3 for the MSB, in which case that resistor and each of the resistors 31, 32 . . . 33 has a value of 10 percent of 2R, and for R = 25K ohms, 5K ohms. It will be appreciated that the values of the compensating resistors are approximate and a more precise value may be determined. Further, compensating resistors for only the first three or four MSB will suffice, consistent with the observations as to the use of compensating resistors in the binary resistance network of FIG. 4.

It is well recognized that in a R = 2R ladder network, the impedance of the network for any given bit position, and thus for the FET switch, is a function of the position of all of the other switches. By employing resistors in the ladder network of relatively high values, in conjunction with the compensating resistors as described, the compensating resistor becomes the primary impedance which the FET switch sees at the output. This therefore tends to reduce the dependency of the impedance of the network as to any given FET switch, on the position of the other switches in the network. Since the output voltage of an FET is primarily a function of its input voltage, the values of the resistors may be selected as set forth above, without significantly affecting the absolute values of the analog output voltages; correspondingly, where two D/A converters are employed in a synchromechanism as in FIG. 5, the effective ratios of the analog output voltages therefrom are maintained with even greater accuracy.

Numerous modification and adaptations of the system of the invention will be apparent to those skilled in the art and thus it is intended by the appended claims to cover all such modifications and adaptations which fall within the true spirit and scope of the invention.

What is claimed is:

1. In a digital to analog converter for converting digital input signals, each including a plurality of bits, to corresponding electrical analog output signals in accordance with first and second direct current reference voltages of equal amplitude and opposite signs and utilizing MOS FET switches, each MOS FET switch including input and output terminals for connection to the source-drain conducting path thereof and a gate terminal, and having a substantially common characteristic of a conducting resistance of said path which varies as a function of the voltage level being switched thereby and defining different first and second resistance values when switching the first and second reference voltages, respectively, and wherein said converter includes a plurality of said MOS FET switches corresponding to the plurality of bits of the digital input signals and selectively rendered conducting in response to digital input bit signals of a given digital input signal, applied to the gate terminals thereof, and an impedance network having a plurality of input terminals connected to the output terminals of corresponding ones of said plurality of MOS FET switches for receiving the outputs thereof when the latter are rendered conductive and respectively establishing analog voltages in the network in accordance with the digital bit positions thereof and the levels of the reference signals, said network summing the analog voltages established therein to produce an analog output signal for each digital input signal, the improvement comprising:

first and second reference voltage supply terminals at which said first and second direct current reference voltages of equal amplitude and opposite sign, respectively, are provided, an inverter having an inverting input terminal and an output terminal, first and second further MOS FET switches respectively connecting, through the source-drain conducting paths thereof, corresponding ones of said first and second supply terminals to said inverting input terminal of said inverter, said further MOS FET switches having said substantially common conducting resistance characteristic as said plurality of MOS FET switches, means responsive to the digital input signal for identifying the required sign of the reference voltage, and selectively applying an enabling signal to the gate terminal of the corresponding one of said further MOS FET switches thereby to enable it to conduct the reference voltage of the required sign through the source-to-drain conducting path thereof for supply to said inverting input terminal of said inverter, said inverter producing the selected reference voltage in opposite sign at its output terminal;

means connecting said output terminal of said inverter to the gate terminal of each of said plurality of MOS FET switches associated with said impedance network for supply of the selected reference voltage, inverted to the respectively opposite sign, to said plurality of MOS FET switches, whereby each said reference voltage is conducted in its original sign by the corresponding further MOS FET switch and in its inverted sign by the selected MOS FET switches associated with the impedance network, thereby establishing for said reference voltages of opposite signs a substantially common series resistance value of the sum of the first and second resistance values of said conducting MOS FET switches in the circuit from each reference voltage supply terminal to the impedance network.

2. A converter as recited in claim 1 wherein said inverter comprises an operational amplifier connected at the inverting input thereof to said selecting means.

3. A digital to analog converter for converting digital input signals, each including a plurality of bits, to corresponding electrical analog output signals in accordance with first and second direct current reference voltages to equal amplitude and opposite signs and utilizing MOS FET switches each including input and output terminals for connection to the source-drain conducting path thereof and a gate terminal, said switches having a substantially common characteristic of a conducting resistance of said path which varies as a function of the voltage level being switched thereby and defining first and second resistance values when switching the first and second reference voltages, respectively, and comprising:

a plurality of said MOS FET switches corresponding to the plurality of bits, means for applying the digital input bit signals to the gate terminals of the corresponding MOS FET switches for selectively rendering said switches conductive, an impedance network having a plurality of input terminals connected to the output terminals of corresponding ones of said plurality of MOS FET switches for receiving the outputs thereof when the latter are rendered conductive and establishing an analog voltage therein in response to each MOS FET switch output received thereby, of a value corresponding to the digital bit position of the output and the levels of the reference signals, said network summing the analog voltages established therein in response to each digital input signal to produce a corresponding analog output signal, first and second reference voltage supply terminals at which said first and second direct current reference voltages of equal amplitude and opposite sign, respectively, are provided, means including an inverter having input and output terminals and receiving a selected one of said reference voltages at said input terminal and producing the selected reference voltage in opposite sign at its output terminal for supply in common to the input terminals of the plurality of MOS FET switches, and first and second further MOS FET switches respectively connecting, through the source-drain conducting paths thereof, corresponding ones of said first and second supply terminals to said inverting input terminal of said inverter, said further MOS FET switches having said substantially common conducting resistance characteristic as said plurality of MOS FET switches, means responsive to the digital input signal for identifying the required sign of the reference voltage, and selectively applying an enabling signal to the gate terminal of the corresponding one of said further MOS FET switches thereby to enable it to conduct the reference voltage of the required sign through the source-to-drain conducting path thereof for supply to said inverting input terminal of said inverter, said inverter producing the selected reference voltage in opposite sign at its output terminal;

means connecting said output terminal of said inverter to the gate terminal of each of said plurality of MOS FET switches associated with said impedance network for supply of the selected reference voltage, inverted to the respectively opposite sign, to said plurality of MOS FET switches, whereby each said reference voltage is conducted in its original sign by the corresponding further MOS FET switch and in its inverted sign by the selected MOS FET switches associated with the impedance network, thereby establishing for said reference voltages of opposite signs, a substantially common series resistance value of the sum of the first and second resistance values of said conducting MOS FET switches in the circuit from each reference voltage supply terminal to the impedance network.

4. A converter as recited in claim 3 wherein said plurality of MOS FET switches and said further MOS FET switch are provided in a common integrated semiconductor structure.

5. A converter as recited in claim 3 wherein said inverter comprises an operational amplifier connected at the inverting input thereof to said selecting means.

6. A converter as recited in claim 5 wherein said operational amplifier has an input resistance equal to the resistance of the impedance network for the most significant bit.

7. An inverter as recited in claim 3 wherein said impedance network includes a compensating resistor for at least the second most significant bit position, connected between the input terminal for that bit position and ground, of a value to present the same resistance to the associated MOS FET switch for that position as is presented to the MOS FET switch for the most significant bit position by the network.

8. A converter as recited in claim 3 wherein said impedance network comprises a binary resistance network.

9. A converter as recited in claim 8 wherein said binary resistance network includes resistors connected between the input terminals thereof and a common summing junction, from each of the most significant bit to the least significant bit input terminals thereof and wherein the resistors are of values R, 2R . . . $2^N$R from the most significant to the least significant bit positions and wherein:

said binary resistance network furthermore includes a compensating resistor connected between the input terminal and ground, of a value related to the resistor for the corresponding bit position in accordance with:

$X = (2^{N-1} \cdot R/2^{N-1} - 1)$ where N is the bit position in question and X is the value of the compensating resistor, for at least the bit position of the next lesser significance than the most significant bit position.

10. A converter as recited in claim 3 wherein said impedance network comprises an R—2R resistance ladder network including a plurality of resistors of value 2R corresponding to the number of bit positions and each 2R resistor being connected at a first terminal thereof to an input terminal of the network, and a plurality of series connected resistors of value R of adjacent ones of the resistors of value 2R, the junction of the 2R resistor for the least significant bit and the series circuit of resistors of value R being connected to ground through a resistor of value 2R and wherein:

a compensating resistor of value 2R is connected between the input terminal and ground for at least the bit position of the next lesser significance than the most significant bit position.

11. A converter as recited in claim 3 wherein said impedance network comprises an R—2R resistance ladder network including a plurality of resistors of value 2R corresponding to the number of bit positions and each 2R resistor being connected at a first terminal thereof to an input terminal of the network, and a plurality of series connected resistors of value R of adjacent ones of the resistors of value 2R, the junction of the 2R resistor for the least significant bit and the series circuit of resistors of value R being connected to ground through a resistor of value 2R and wherein:

a compensating resistor of a value of 10 percent of 2R is connected between the input terminal and ground for each of the most significant bit positions and at least the next less significant bit position.

12. A digital to synchro converter for generating first and second analog voltages for supply to a synchro for excitation of corresponding windings thereof to control the rotor angular position, and including first and second digital to analog converters respectively responsive to corresponding, successive digital data signal inputs, each including a plurality of bits, for generating the corresponding first and second analog control voltages in accordance with first and second reference voltages of equal amplitude and opposite signs and utilizing MOS FET switches each including input and output terminals for connection to the source-drain conducting path thereof and a gate terminal, said switches having a substantially common characteristic of a conducting resistance of said path which varies as a function of the voltage level being switched thereby and defining first and second resistance values when switching the first and second reference voltages, respectively, wherein each of said digital to analog converters comprises:

a plurality of said MOS FET switches corresponding to the plurality of bits, means for applying the digital input bit signals to the gate terminals of the corresponding MOS FET switches for selectively rendering said switches conductive, an impedance network having a plurality of input terminals connected to the output terminals of corresponding ones of said plurality of MOS FET switches for receiving the outputs thereof when the latter are rendered conductive and establishing an analog voltage therein in response to each MOS FET switch output received thereby, of a value corresponding to the digital bit position of the output and the levels of the reference signals, said network summing the analog voltages established therein in response to each digital input signal to produce a corresponding analog output signal, means including an inverter having input and output terminals and receiving a selected one of said reference voltages at said input terminal and producing the selected reference voltage in opposite sign at its output terminal for supply in common to the input terminals of the plurality of MOS FET switches, first and second further MOS FET switches respectively connecting, through the source-drain conducting paths thereof, corresponding ones of said first and second supply terminals to said inverting input terminal of said inverter, said further MOS FET switches having said substantially common conducting resistance characteristic as said plurality of MOS FET switches, means responsive to the digital input signal for identifying the required sign of the reference voltage, and selectively applying an enabling signal to the gate terminal of the corresponding one of said further MOS FET switches thereby to enable it to conduct the reference voltage of the required sign through the source-to-drain conducting path thereof for supply to said inverting input terminal of said inverter, said inverter producing the selected reference voltage in opposite sign at its output terminal;

means connecting said output terminal of said inverter to the gate terminal of each of said plurality of MOS FET switches associated with said impedance network for supply of the selected reference voltage, inverted to the respectively opposite sign, to said plurality of MOS FET switches, whereby each said reference voltage is conducted in its original sign by the corresponding further MOS FET switch and in its inverted sign by the selected MOS FET switches associated with the impedance network, thereby establishing for said reference voltages of opposite signs, a substantially common series resistance value of the sum of the first and second resistance values of said conducting MOS FET switches in the circuit from each reference voltage supply terminal to the impedance network, and means for applying the first and second analog voltages from said first and second digital to analog converters to the respectively corresponding windings of the synchro.

13. A digital to synchro converter as recited in claim 12 wherein the MOS FET switches of each of said digital to analog converters are included in a common integrated circuit structure.

* * * * *